(12) United States Patent
Jin et al.

(10) Patent No.: US 7,582,492 B2
(45) Date of Patent: Sep. 1, 2009

(54) METHOD OF DOPING IMPURITIES, AND ELECTRONIC ELEMENT USING THE SAME

(75) Inventors: Cheng-Guo Jin, Osaka (JP); Yuichiro Sasaki, Tokyo (JP); Bunji Mizuno, Nara (JP); Katsumi Okashita, Tokyo (JP); Hiroyuki Ito, Chiba (JP); Tomohiro Okumura, Osaka (JP); Satoshi Maeshima, Hyogo (JP); Ichiro Nakayama, Osaka (JP)

(73) Assignee: Panasonic Corporation, Osaka (JP)

( * ) Notice: Subject to any disclaimer, the term of this patent is extended or adjusted under 35 U.S.C. 154(b) by 65 days.

(21) Appl. No.: 11/597,166

(22) PCT Filed: May 19, 2005

(86) PCT No.: PCT/JP2005/009176

§ 371 (c)(1),
(2), (4) Date: Aug. 15, 2007

(87) PCT Pub. No.: WO2005/114713

PCT Pub. Date: Dec. 1, 2005

(65) Prior Publication Data

US 2008/0061292 A1 Mar. 13, 2008

(30) Foreign Application Priority Data

May 21, 2004 (JP) .............................. 2004-152300

(51) Int. Cl.
*G01R 31/26* (2006.01)
*H01L 21/66* (2006.01)
(52) U.S. Cl. .................. 438/16; 438/513; 438/514; 438/798; 257/437; 257/E21.328

(58) Field of Classification Search ................ 438/513, 438/514, 16, 798; 257/437, E21.328
See application file for complete search history.

(56) References Cited

U.S. PATENT DOCUMENTS 5,401,666 A    3/1995   Tsukamoto (Continued)

FOREIGN PATENT DOCUMENTS

EP    1 667 212 A1    6/2006

(Continued)

OTHER PUBLICATIONS

Mizuno, B., et al., "Plasma Doping", Solid-state and Integrated Circuits Technology, 2004, vol. 1, Oct. 18, 2004, Proceedings. 7th International Conference on Beijing, China, Oct. 18-21, 2004, Piscataway, NJ, USA, IEEE, US.

(Continued)

*Primary Examiner*—Matthew Smith
*Assistant Examiner*—John M Parker
(74) *Attorney, Agent, or Firm*—McDermott Will & Emery LLP

(57) ABSTRACT

The invention provides a method of doping impurities that includes a step of doping impurities in a solid base substance by using a plasma doping method, a step of forming a light antireflection layer that functions to reduce light reflection on the surface of the solid base substance, and a step of performing annealing by light radiation. According to the method, it is possible to reduce the reflectance of light radiated during annealing, to efficiently apply energy an impurity doped layer, to improve activation efficiency, to prevent diffusion, and to reduce sheet resistance of the impurity doped layer.

10 Claims, 5 Drawing Sheets

U.S. PATENT DOCUMENTS

| | | |
|---|---|---|
| 5,969,398 A | 10/1999 | Murakami |
| 6,128,084 A | 10/2000 | Nanbu et al. |
| 6,303,476 B1 | 10/2001 | Hawryluk et al. |
| 6,597,463 B1 * | 7/2003 | Singh et al. ............... 356/630 |
| 2002/0004260 A1 | 1/2002 | Furuta et al. |
| 2002/0160592 A1 | 10/2002 | Shon |
| 2003/0207476 A1 | 11/2003 | Eriguchi et al. |

FOREIGN PATENT DOCUMENTS

| | | |
|---|---|---|
| JP | 58-116730 | 7/1983 |
| JP | 6-5536 | 1/1994 |
| JP | 11-54451 | 2/1999 |
| JP | 11-87448 | 3/1999 |
| JP | 2000-323713 | 11/2000 |
| JP | 2002-343734 | 11/2002 |
| WO | WO 98/57146 | 12/1998 |

OTHER PUBLICATIONS

Tseng, C-H., et al., "Study on dopant activation of phosphorous implanted polycrystalline silicon thin films by KrF excimer laser annealing", Solid State Electronics, 2002, pp. 1085-1090, vol. 46, Elsevier Science Ltd.

Supplementary European Search Report, issued in patent Application No. EP 05 74 1536, dated Nov. 3, 2008.

* cited by examiner

METHOD OF DOPING IMPURITIES, AND ELECTRONIC ELEMENT USING THE SAME

RELATED APPLICATIONS

This application is the U.S. National Phase under 35 U.S.C. 371 of International Application No. PCT/JP2005/009176, filed on May 19, 2005, which in turn claims the benefit of JP2004-152300, filed on May 21, 2004, the disclosures of which Applications are incorporated by reference herein.

TECHNICAL FIELD

The present invention relates to a method of doping impurities and an electronic element, and particularly, to a method of optimizing impurity doping and activation during the formation of the electronic element, and a method of manufacturing an electronic element on a liquid crystal panel by using the method.

BACKGROUND ART

As the size of a semiconductor has been decreased in recent years, there has been a demand for a technology that is used to form shallow bonding. A method of implanting ions of various conductive impurities such as boron (B), phosphorus (P), and arsenic (As) into the surface of a semiconductor substrate used as a solid base substance with low energy has been widely used in a method of manufacturing a semiconductor in the related art.

Although it is possible to form shallow bonding by using the method of implanting ions, there is a limitation on depth of bonding that can be formed by ion implantation. For example, it is difficult to dope a boron impurity at a small thickness, and the depth of the doped region is limited to about 10 nm from the surface of the base substance in the ion implantation.

For this reason, various doping methods have been proposed as a method of forming shallow bonding in recent years. A plasma doping technology of the various doping methods comes into the spotlight as a technology suitable for practical application. The plasma doping is a technology in which reaction gas containing impurities to be doped is plasma-excited and plasma is radiated on the surface of the solid base substance so as to dope the impurities. Further, after the impurities are doped, an annealing process is performed so as to activate the doped impurities.

In general, a light source capable of emitting electromagnetic waves, such as visual light, infrared light, and ultraviolet light, in the wide wave length band is used in the annealing process. However, since the light reflection is high on the surface of the substrate, there are problems that the light absorptance of an impurity doped layer is low and the activation efficiency is low.

In recent years, the following method has been proposed (for example, Patent Document 1). According to the method, Ge ions are implanted into a semiconductor substrate so that the semiconductor substrate is changed to have pre-amorphous structure. Then, impurities are doped by ion implantation, and an absorption layer having a high light absorption coefficient is formed thereon. Further, an oxide layer is firmed as a part of the absorption layer so as to adjust reflectance.

Patent Document 1: U.S. Pat. No. 6,303,476

The above-mentioned method is a method that is performed on the ion implanted layer. An oxide layer was formed to reduce the reflectance. However, large energy needs to be radiated in an annealing process to reduce the sheet resistance. In particular, since laser radiation area per one laser radiation is small in a laser annealing, there is a problem that it is difficult to reduce the sheet resistance. In particular, when an impurity doped depth is reduced to form shallow bonding, or when a shallower contact is formed in bonding, carrier density is increased to improve activation efficiency by annealing. For this reason, large energy is needed. As a result, since the diffusion length of the impurities is increased, it is difficult to finely form a shallow impurity doped region.

DISCLOSURE OF THE INVENTION

The invention has made to solve the above-mentioned problems, and it is an object of an aspect of the invention to reduce reflectance, to efficiently apply energy an impurity doped layer, and to reduce sheet resistance of the impurity doped layer.

The inventors have found out the followings. That is, when doping conditions and an antireflection layer are optimally combined, it is possible to further reduce the reflectance of light radiated during annealing as compared to the related art. Further, when energy is applied to an impurity doped layer during annealing, it is possible to reduce sheet resistance of the impurity doped layer.

According to an aspect of the invention, a method of doping impurities includes a step of doping impurities in a solid base substance by using a plasma doping method, a step of forming a light antireflection layer, which functions to reduce light reflection, on the surface of the solid base substance, and a step of performing annealing by light radiation.

According to the above-mentioned method of doping impurities, since the reflectance of light radiated during annealing is reduced, it is possible to efficiently apply energy an impurity doped layer and to reduce sheet resistance of the impurity doped layer.

Further, according to the above-mentioned method of doping impurities, the step of doping impurities in a solid base substance by using a plasma doping method includes a step of measuring the optical characteristics and thickness of the impurity doped region, and a step of selecting a light antireflection layer on the basis of the measured optical characteristic and thickness.

According to the above-mentioned method of doping impurities, the optical characteristics of the impurity doped region are measured in advance, and an optimal antireflection layer is formed on the basis of the optical characteristics and then annealed. In addition, the reflectance is reduced with high accuracy, and energy and efficient light is efficiently radiated to the impurity doped layer to activate the doped impurities. As a result, it is possible to reduce sheet resistance of the impurity doped layer.

According to the above-mentioned method of doping impurities, a light antireflection layer is selected in the step of selecting so that the absorptance of the light used in the step of performing annealing into the impurity doped region is maximum.

According to the above-mentioned method of doping impurities, the light antireflection layer is selected so that the absorptance of the light into the impurity doped region is maximum. Accordingly, it is possible to more efficiently activate the doped impurities, and to activate the doped impurities with minimum energy. For this reason, it is possible to reduce a diffusion length, to maintain a small impurity doped depth, and to improve activation efficiency by annealing. As a result, since carrier density is increased, it is possible to form a fine and shallow impurity doped region with low resistance.

Further, the above-mentioned method further includes a step of changing the surface of the solid base substance into amorphous structure by using plasma, before the step of doping impurities.

According to the above-mentioned method of doping impurities, the step of changing the surface of the solid base substance into amorphous structure by using plasma is performed before the step of doping impurities by using plasma. Accordingly, it is possible to more improve the light absorptance of the impurity doped region. Even in this case, when a light antireflection layer is formed, it is possible to further reduce the reflectance of light radiated during annealing and to efficiently apply energy to the impurity doped layer. As a result, it is possible to reduce resistance of the impurity doped layer. Furthermore, since the optical characteristic of a region having amorphous structure is different from that of other region, energy absorptance is selectively increased only in the region having amorphous structure. As a result, it is possible to form an impurity doped region having high carrier concentration in a shallower region.

Further, in the above-mentioned method of doping impurities, the optical characteristics include any one of a refraction index, extinction coefficient, absorption coefficient, reflectance, transmittance, and absorptance.

For example, the reflectance and transmittance of the impurity doped region are measured, and the light antireflection layer is selected so that the sum of the reflectance and transmittance is minimum. As a result, it is possible to obtain larger quantity of absorbed light. In addition, it is preferable that the antireflection layer be selected so as to selectively activate the impurity doped region.

Further, a liquid crystal substrate is used as the solid base substance in the above-mentioned method of doping impurities.

According to the above-mentioned method of doping impurities, when plasma doping is performed on the liquid crystal substrate, the light antireflection layer is effective and it is possible to efficiently apply the light antireflection layer to a semiconductor process. In addition, the light antireflection layer is effective against a substrate having SOI structure (crystal silicon/oxide layer/crystal silicon), strain-silicon substrate, and polysilicon substrate.

Furthermore, in the above-mentioned method of doping impurities, the light antireflection layer is a translucent layer that has a refraction index lower than that of the impurity doped region.

According to the above-mentioned method of doping impurities, it is possible to reduce the reflectance by using the interference of the translucent layer that has a refraction index lower than that of the impurity doped region. Considering the consistency and usability in the device process, a translucent layer, such as $SiO_2$ or $Si_3N_4$, which is widely used in a Si device process, is preferable. If the composition of $SiO_2$ or $Si_3N_4$ is adjusted, it is possible to adjust the optical characteristic with higher accuracy.

Further, in the above-mentioned method of doping impurities, the light antireflection layer is a dielectric multilayer.

When a single layer made of $SiO_2$ is used, there is a limitation on reflectance. However, according to this method of doping impurities, it is possible to use the interference of the dielectric multiplayer in which two dielectric layers having different refraction indexes are laminated on each other. Further, as the number of the laminated layers is increased, the reflectance is reduced. For this reason, it is possible to further reduce the reflectance.

Furthermore, in the above-mentioned method of doping impurities, light having a wavelength of 500 nm or more is used to perform annealing.

The light having a wavelength of 500 nm or more has a small absorption coefficient. For this reason, the light travels to a deep position. As a result, multiple scattering of the light easily occurs in the impurity doped layer as well as the antireflection layer. Physical properties of the impurity doped layer have a significant effect on the thickness of the antireflection layer when the reflectance is minimum. According to the above-mentioned method of doping impurities, the physical properties of the impurity doped layer are controlled in the step of changing the solid base substance into amorphous structure by using plasma and the step of doping impurities by using plasma. As a result, it is possible to significantly reduce the reflectance as compared to the related art.

In addition, the above-mentioned method of doping impurities according to the invention includes the step of minimizing the reflectance and the step of calculating the thickness of the light antireflection layer optimized in the impurity doped layer. The thickness of the light antireflection layer may be calculated by a multilayer calculation software. As the number of layers is increased, the calculation is complicated. For this reason, the multilayer calculation software is used to improve the calculation efficiency. A calculation software called as "Optas-Film" was used in this calculation. It is possible to also use a lens design software, such as a software called as "Code V".

Any one of a plasma CVD method, sputtering method, or ion plating method may be used in the step of forming the light antireflection layer of the above-mentioned method of doping impurities according to the invention.

In addition, a thermosetting method may be used to form a $SiO_2$ layer as an antireflection layer. However, since the process temperature is 900° C. or more, the doped impurities are deeply diffused. According to this method, any one of a plasma CVD method, sputtering method, or ion plating method capable of lowering the process temperature (to 600° C. or less) may be used. For this reason, it is possible to suppress the diffusion of impurities and to control the diffusion length of the impurities with high accuracy.

Further, the above-mentioned method of doping impurities further includes a step of feeding back the measurement results of the optical characteristics in the impurity doped region to the thickness of the antireflection layer.

The optical characteristics of the impurity doped region and the thickness (or optical characteristic) of the antireflection layer having a small reflectance are changed due to the step of doping impurities. According to the above-mentioned method of doping impurities, since the measurement results of the optical characteristics in the impurity doped region is fed back to the thickness of the antireflection layer, it is possible to form a more optimal antireflection layer.

Further, the above-mentioned method of doping impurities further includes a step of feeding back the measurement results of the optical characteristics in the impurity doped region to a plasma doping step.

According to the above-mentioned method of doping impurities, when the measurement results of the optical characteristics in the impurity doped region is different from a set value, additional plasma doping processes are performed so that the optical characteristics of the impurity doped region accords with the set value. As a result, it is possible to obtain surfaces optimized for annealing conditions, and to obtain an impurity doped region that has a high efficiency and does not have deviation.

An electronic element according to the invention is formed by using the above-mentioned method of doping impurities.

Figure 1:
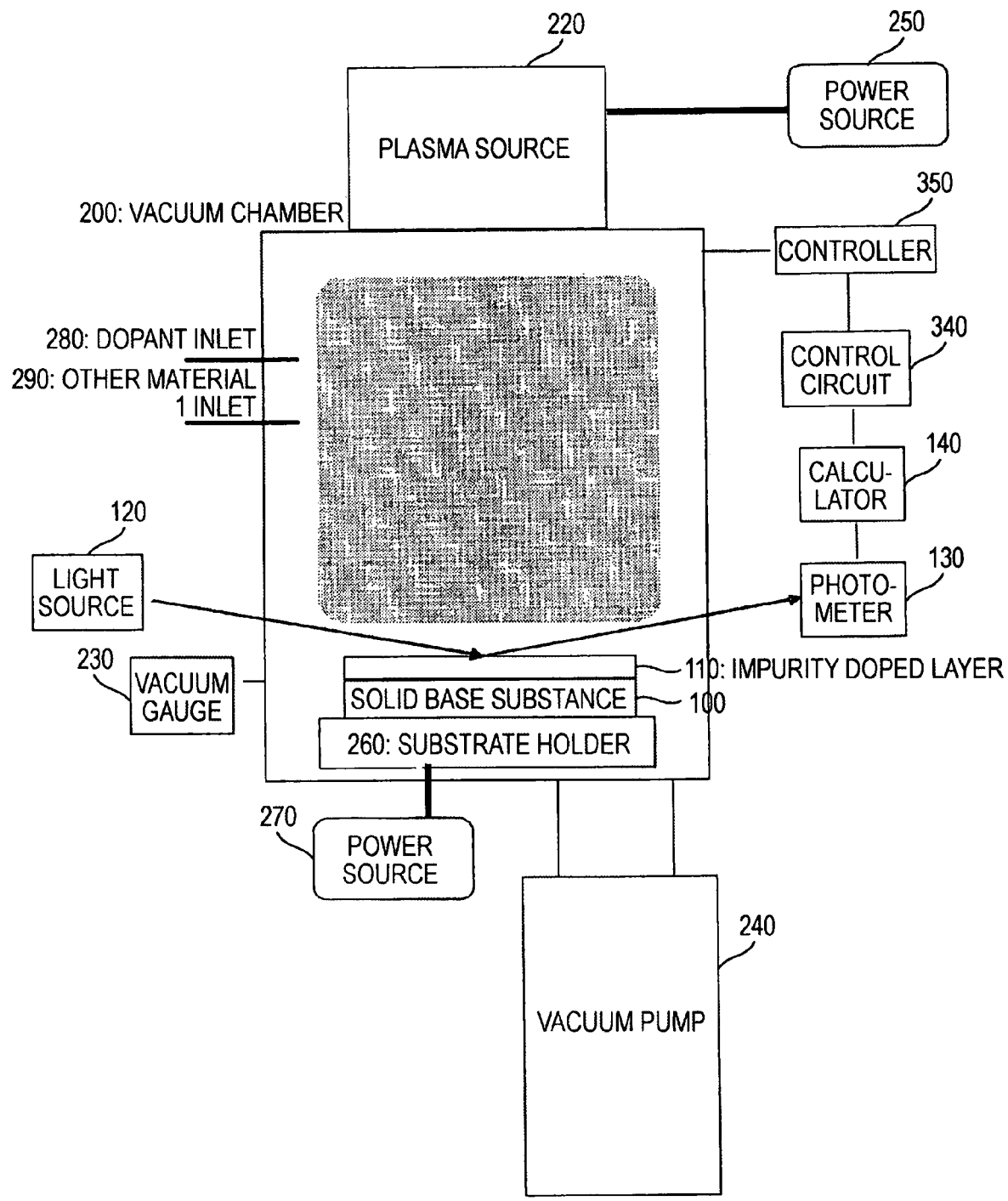
FIG. 1 is a view showing a plasma doping apparatus according to an embodiment of the invention.

REFERENCE NUMERALS 100 solid base substance
110 impurity doped layer
120 light source
130 photometer
200 vacuum chamber
210 rectangular shape indicating plasma
220 plasma source
230 vacuum gauge
240 vacuum pump
250 power source
260 substrate holder
270 power source
280 dopant inlet
290 other material 1 inlet
340 control circuit
350 controller
400 vacuum chamber
410 substrate supporting table
420 substrate
430 vaporable material
440 vaporization power source
450 matching box
460 high frequency power source
470 heating DC power source
480 RF coil
490 vacuum gauge
500 Antireflection Layer

BEST MODE FOR CARRYING OUT THE INVENTION

Hereinafter, preferred embodiments of the invention will be described.

First Embodiment (Impurities Doping)

First, a plasma doping apparatus used in this embodiment and a process for doping impurities will be described below. As shown in FIG. 1, the plasma doping apparatus used in this embodiment includes a vacuum chamber 200, and a plasma source 220 for exciting plasma in the vacuum chamber 200. The plasma doping apparatus performs plasma doping on the surface of a solid base substance 100, which is placed on a substrate holder 260 and used as a base substance to be processed.

Further, a vacuum pump 240 is connected to the vacuum chamber 200, and a vacuum gauge 230 for measuring degree of vacuum is provided to the vacuum chamber 200. Furthermore, a power source 250 is connected to the plasma source 220 so as to adjust a voltage used to generate plasma. In addition, another power source 270 for independently applying electric potential is connected to the substrate holder 260 so as to be separated from the above-mentioned power source.

A gas feed mechanism used to feed gas is provided in the vacuum chamber 200. The gas feed mechanism includes a first line 280 through which a first material (in this case, $B_2H_6$) used as a dopant is supplied, and a second line 290 through which a second material (in this case, He) used as another material is supplied.

A method of doping impurities using the doping apparatus will be described below.

First, a first material used as a dopant is supplied to the vacuum chamber 200. In this case, the dopant and another material different from the dopant are fed to the vacuum chamber as carrier gas. In this embodiment, gas having a characteristic different from the dopant, for example, a material that is not electrically activated in a silicon, such as rare gas, was selected as another material. He is used as an example of another material. He was selected as the second material. Meanwhile, gas is feed through the gas feed line including the above-mentioned first and second lines 280 and 290, and plasma 210 is generated on the surface of the solid base substance 100 in the vacuum chamber 200.

Since charged particles in the plasma are attracted due to the difference of electric potential between the plasma 210 and the solid base substance 100, impurities are doped. Electrically neutral materials in the plasma are attached to or occluded in a portion of the solid base substance 100 near the surface thereof. In this case, the state of an impurity doped layer 110 depends on the state of the solid base substance 100 used as a base and the energy of the plasma, and may be an attached state or occluded state.

Due to the process for doping impurities, the impurity doped layer 110 is formed on the surface of the solid base substance 100. A light source 120 and a photometer 130 are provided in the vacuum chamber 200 to measure physical properties (refraction index n, extinction coefficient k, and thickness d) of the impurity doped layer.

Optical characteristics measured by the photometer 130 are computed by a calculator 140. When the computed result is different from a set value, the computed result is sent to a control circuit 340. Data is sent to a controller 350 as feedback information, so that the plasma doping apparatus adjusts plasma conditions and performs additional plasma doping. As a result, the optical characteristics of the region in which impurities are doped accords with the set value. The adjusted plasma conditions include a power supply voltage applied to the plasma, voltage application time period and time, a mixing ratio of the dopant and another material, degree of vacuum, a mixing ratio of other materials, and a ratio of time period for radiating plasma containing dopants and time period for radiating plasma not containing dopants. The above-mentioned parameters are changed to control physical properties of the impurity doped layer.

According to this method, it is possible to form an impurity doped layer having a desired impurity concentration that is controlled with high accuracy.

(Formation Of Antireflection Layer)

A method of forming a silicon oxide layer used as an antireflection layer will be described below. A silicon oxide layer is formed using an ion plating method in this embodiment.

Figure 2:
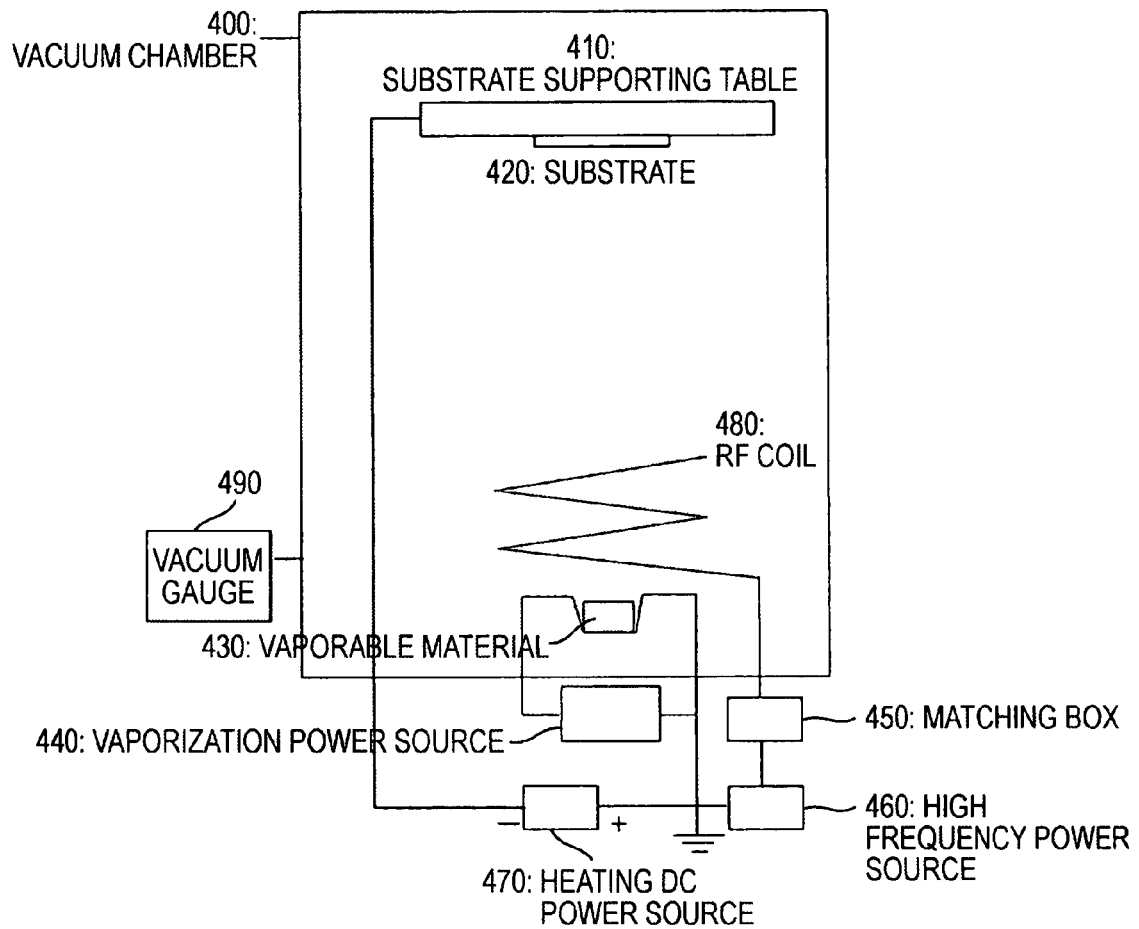
FIG. 2 is a view showing an ion plating apparatus.

As shown in FIG. 2, an ion plating apparatus used herein includes a substrate supporting table 410 provided in a vacuum chamber 400, a vaporable material 430 disposed so as to face a substrate 420 supported by the substrate supporting table 410, an RF coil 480 for changing gas vaporized from the vaporable material 430 into plasma. Further, a vaporization power source 440 and a high frequency power source 460 are formed through a matching box 450. The vaporization power source 440 supplies heat energy to the vaporable material 430 so as to vaporize the vaporable material 430, and the high frequency power source 460 applies a voltage to the RF coil. Here, reference numeral 470 indicates a heating DC power source, and a vacuum gauge 490 is provided to the vacuum chamber.

In this case, when the silicon oxide layer is formed, silicon oxide particles are used as the vaporable material. The vaporable material 430 is vaporized by an electron gun (not shown) driven by the vaporization power source 440. Further, the substrate supporting table 410 is provided in the vacuum chamber 400 to support the solid base substance used as the substrate 420. Then, the solid base substance 420, in which impurities are doped by using a plasma doping method, is placed on the substrate supporting table 400. The electron gun is fired to the vaporable material ($SiO_2$ particles) 430 by using the vaporization power source 440 so as to vaporize $SiO_2$. The vaporized particles are ionized by the plasma that is generated by the high frequency power source 460, the matching box 450, and the RF coil 480. Then, the vaporized particles collide against the solid base substance 420, which is kept to have negative electric potential, with acceleration. As a result, a silicon oxide layer having a strong adhesion is formed densely.

According to this method, while the temperature of the solid base substance does not rise, it is possible to form a silicon oxide layer, which has a desired thickness, with excellent controllability.

(Optimization of Antireflection Layer)

Figure 3:
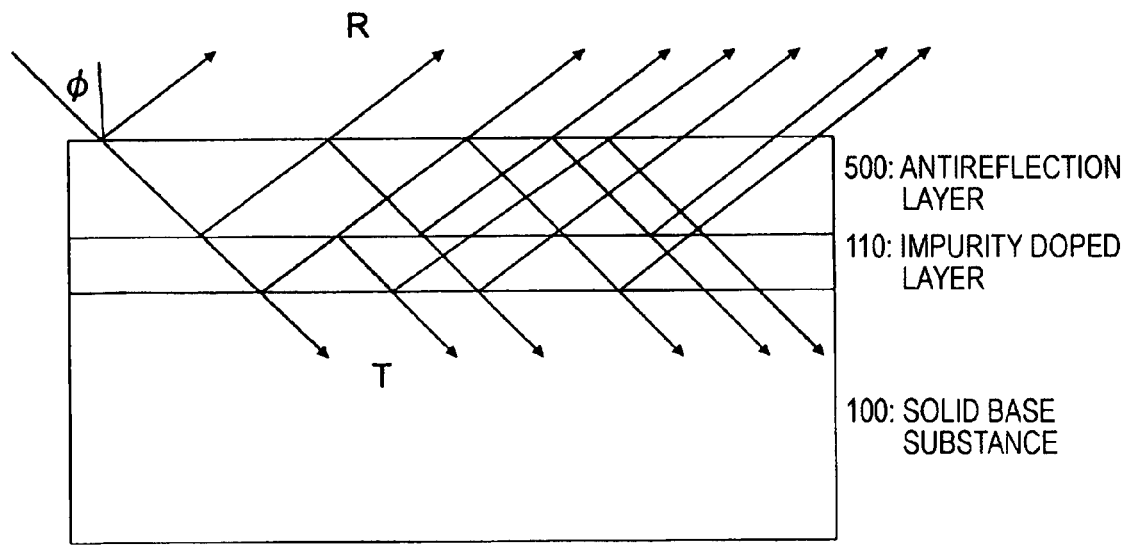
FIG. 3 is a schematic view of a light antireflection layer.

Next, a method of calculating an optimal thickness of a light antireflection layer so as to reduce reflectance will be described with reference to FIG. 3. First, an antireflection layer 50 is formed on the impurity doped layer 110, and light having a wavelength λ is radiated onto a substrate at an incident angle φ (φ=0°, vertical radiation). Physical properties of each layer are inputted using a multilayer calculation software, and reflectance R and transmittance T are obtained using the multiple scattering. Further, absorptance A is obtained using the following expression.

$$A=1-R-T \tag{1}$$

Figure 4:
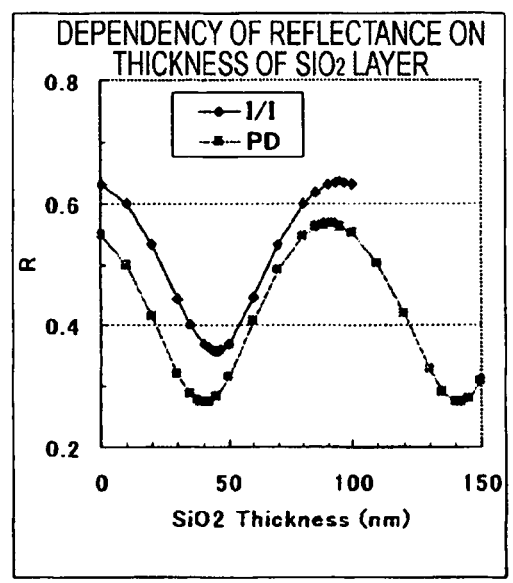
FIG. 4 is a view showing calculation results of dependency of reflectance R on the thickness of a silicon oxide layer, when an impurity doped layer is formed of a plasma doping layer and an ion implanted layer, respectively, an antireflection layer is formed of a $SiO_2$ layer, and wavelength is 300 nm.
Figure 5:
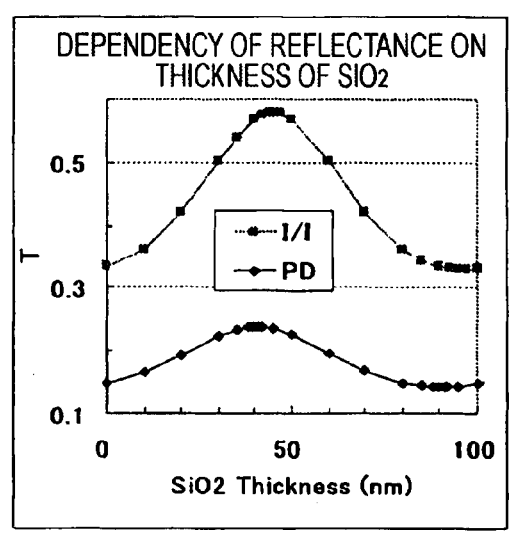
FIG. 5 is a view showing calculation results of dependency of transmittance T on the thickness of a silicon oxide layer, when an impurity doped layer is formed of a plasma doping layer and an ion implanted layer, respectively, an antireflection layer is formed of a $SiO_2$ layer, and wavelength is 300 nm.
Figure 6:
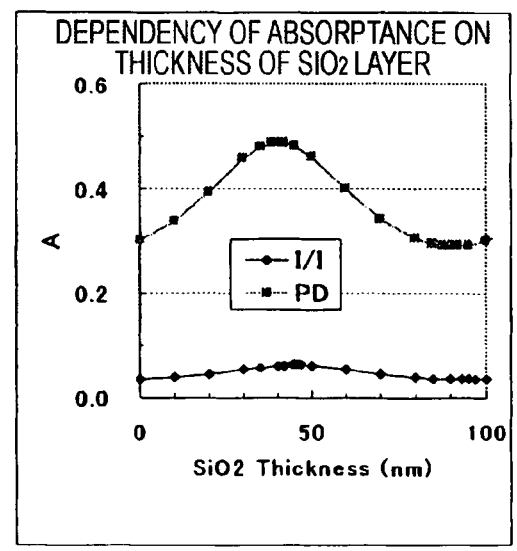
FIG. 6 is a view showing dependency of absorptance A on the thickness of a silicon oxide layer, when an impurity doped layer is formed of a plasma doping layer and an ion implanted layer, respectively, an antireflection layer is formed of a $SiO_2$ layer, and wavelength is 300 nm.

FIGS. 4 to 6 shows calculation results of dependency of reflectance R, transmittance T, and absorptance A on the thickness of a silicon oxide layer, when the impurity doped layer is formed of a plasma doping layer (hereinafter, referred to as a PD layer) and an ion implanted layer (hereinafter, referred to as an I/I layer), respectively, the antireflection layer is formed of a $SiO_2$ layer, and wavelength is 300 nm. In this case, the reflectance is a ratio of an amount of reflected light to an amount of entire incident light. The transmittance is a ratio of an amount of light transmitting the impurity doped layer to an amount of entire incident light. The absorptance is a ratio of an amount of light absorbed in the impurity doped layer to an amount of entire incident light.

As shown in FIG. 4, when the silicon oxide layer is not formed, the reflectance of the PD layer is 55%. When the silicon oxide layer is formed to have a thickness of 40 nm, the reflectance is reduced up to 25%. Meanwhile, as shown in FIG. 6, when the silicon oxide layer is not formed, the absorptance of the PD layer is 30%. When the silicon oxide layer is formed to have a thickness of 40 nm, the absorptance is increased up to 48%. Each of the reflectance R, transmittance T, and absorptance A has the periodic structure of the thickness of the silicon oxide layer. For this reason, even though the thickness of the silicon oxide layer is set to 40 nm, 140 nm, 240 nm, (at a cycle of 100 nm), the values of the reflectance R, transmittance T, and absorptance A are constant.

When the silicon oxide layer is formed to have a thickness of 45 nm, it is possible to obtain a minimum reflectance (36%) of the I/I layer. However, when the silicon oxide layer is formed to have a thickness of 40 nm, it is possible to obtain a minimum reflectance (28%) of the PD layer. Further, it is understood that the combination of the PD layer and the silicon oxide layer is more effective to reduce the reflectance.

Figure 7:
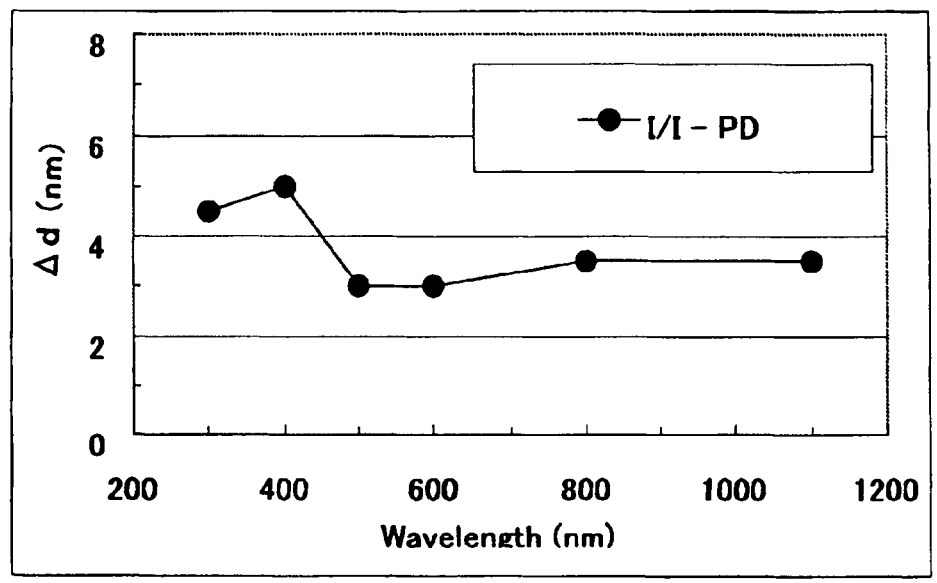
FIG. 7 is a view showing differences between the optimal thickness (thickness of $SiO_2$ layers when reflectance is minimum) of $SiO_2$ layers of an I/I layer and a PD layer, which are plotted on a wavelength axis.

Differences between the optimal thickness (thickness of $SiO_2$ layers when the reflectance is minimum) of $SiO_2$ layers of the I/I layer and the PD layer were plotted on a wavelength axis in FIG. 7. Differences between the optimal thickness of $SiO_2$ layers of the I/I layer and the PD layer were confirmed in the wavelength range of 300 to 1100 nm.

As described above, the thickness of the antireflection layer is adjusted, and the T value is determined so that the reflectance is minimum.

In the case when the thickness of the antireflection layer has been determined, the material of the antireflection layer may be adjusted so as to adjust optical characteristics thereof.

The antireflection layer determined as described above is formed, and annealing is performed under conditions based on the light radiation conditions when the optimal antireflection layer is formed. As a result, it is possible to easily form an impurity doped region that has a small thickness and low sheet resistance.

(Annealing)

Figure 8:
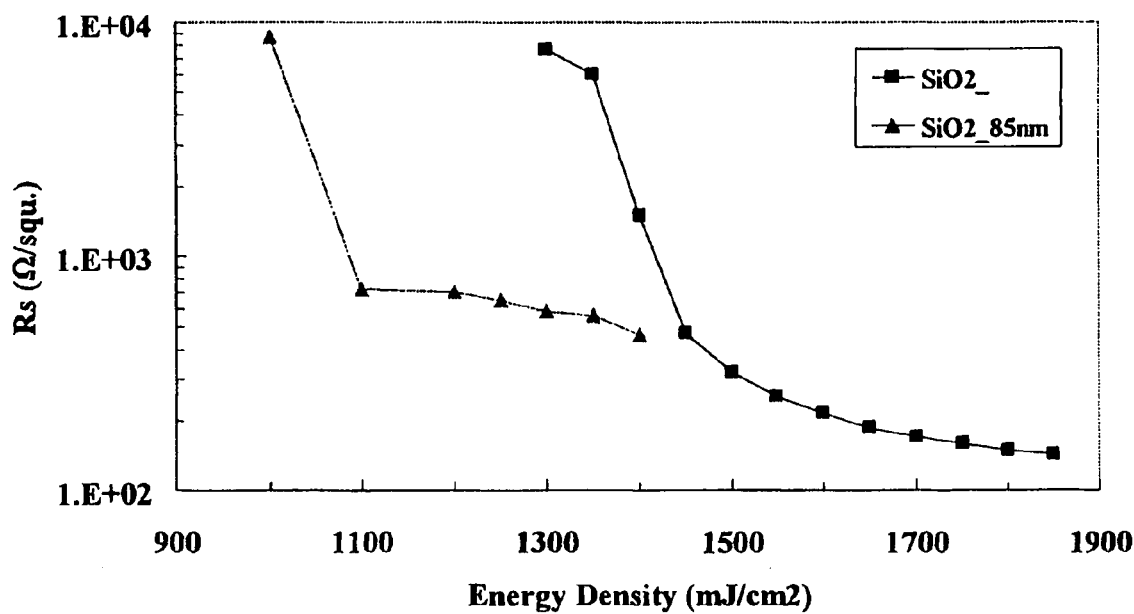
FIG. 8 is a view showing a relationship between laser energy density and sheet resistance in a plasma doping sample without an oxide silicon layer and a plasma doping sample with an oxide silicon layer having a thickness of 85 nm, when annealing is performed using laser having a wavelength of 530 nm.

The relationship between laser energy density and sheet resistance in a plasma doping sample without an oxide silicon layer and a plasma doping sample with an oxide silicon layer having a thickness of 85 nm when the annealing is performed using laser having a wavelength of 530 nm is shown in FIG. 8. When the silicon oxide layer is formed, it is possible to reduce the laser energy density of 330 mJ/cm² (corresponding to 23%) that is required to obtain the same sheet resistance 720 Ω/sq. In addition, when the silicon oxide layer is provided, it is possible to decrease the sheet resistance from 7710 Ω/sq up to the 583 Ω/sq due to the same energy density 1300 mJ/cm$^2$.

Second Embodiment

Next, the following method will be described in this embodiment. According to the method, before impurities are doped by ion implantation, the solid base substance is changed to have amorphous structure and impurities are then doped.

When impurities are doped by ion implantation and annealing is performed, the solid base substance is changed to have amorphous structure by Ge ion implantation for commonly increasing the absorptance and impurities are then doped by ion implantation. In this case, a layer (hereinafter, referred to as a He_PA layer) changed to have amorphous structure by He plasma, and a layer (hereinafter, referred to as a Ge_PAI layer) changed to have amorphous structure by He plasma were compared with each other and then calculated.

Figure 9:
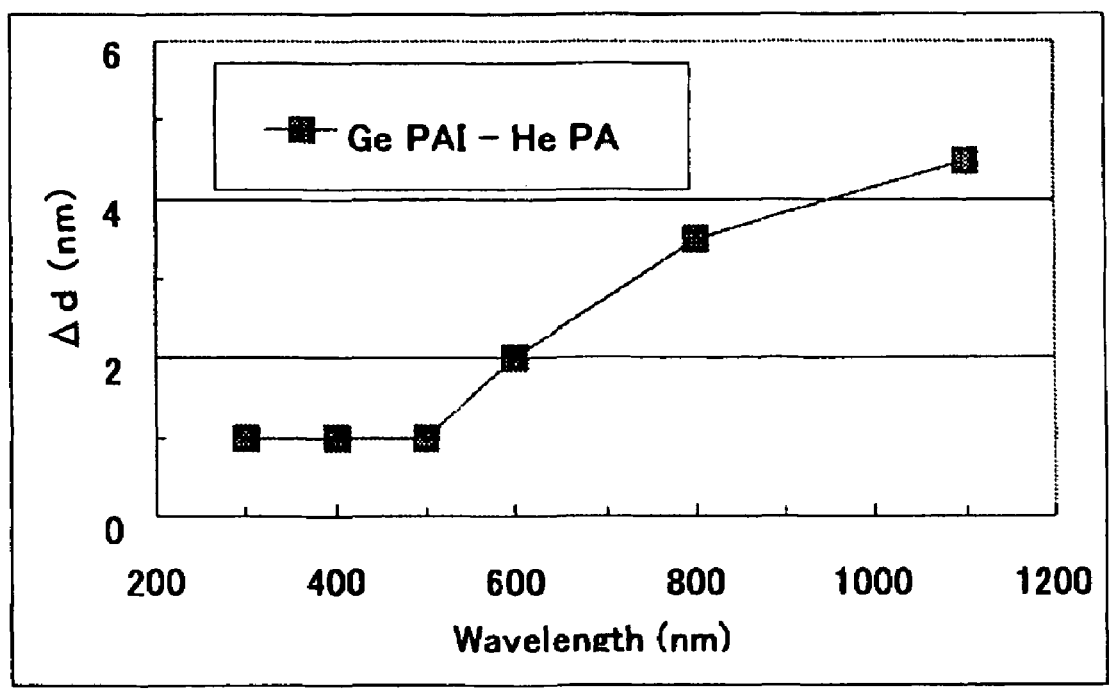
FIG. 9 is a view showing differences between the optimal thickness (thickness of $SiO_2$ layers when reflectance is minimum) of $SiO_2$ layers of a Ge_PAI layer and a He_PA layer, which are plotted on a wavelength axis.

Differences between the optimal thickness (thickness of SiO$_2$ layers when the reflectance is minimum) of SiO$_2$ layers of the Ge_PAI layer and the He_PA layer were plotted on a wavelength axis. The results thereof are shown in FIG. 9. As apparently shown in FIG. 9, differences between the optimal thickness of SiO$_2$ layers of the Ge_PAI layer and the He_PA layer were confirmed in the wavelength range of 500 to 1100 nm.

It is understood that this is caused by difference between physical properties of the He_PA layer and Ge_PAI layer. However, since the silicon oxide layer is formed to have an optimal thickness in any case, it is possible to form a layer having high reliability in which sheet resistance and bonding depth is controlled with high accuracy.

In addition, since the layer (referred to as a He_PA layer) changed to have amorphous structure by He plasma is used in this embodiment, it is possible to form an impurity doped region that has a small thickness and low sheet resistance.

According to this embodiment, before impurities are doped, the solid base substance is changed to have amorphous structure. However, after impurities are doped, the solid base substance may be changed to have amorphous structure by radiation of inactive plasma. Further, while impurities are doped, the solid base substance may be changed to have amorphous structure by radiation of inactive plasma.

INDUSTRIAL APPLICABILITY

According to the invention, a method of doping and activating impurities, which includes a process for forming an antireflection layer and performing annealing, is effective to form a region that has a small thickness and low sheet resistance, to reduce activation energy, and to lower annealing temperature. Further, the method of doping and activating impurities is effective to form a semiconductor device, such as a fine electronic element or a thin film transistor form on a liquid crystal substrate.

The invention claimed is:

1. A method of doping impurities, comprising the steps of:
   measuring optical characteristics and thickness of the impurity doped region;
   selecting a light antireflection layer on the basis of the measured optical characteristics and thickness;
   doping impurities in a solid base substance by using a plasma doping method so as to form an impurity doped region;
   forming a light antireflection layer, which functions to reduce light reflection, on a surface of the solid base substance; and
   performing annealing by light radiation.

2. The method of doping impurities according to claim 1, wherein the light antireflection layer is selected in the step of selecting so that the absorption of the light used in the step of performing annealing into the impurity doped region is maximum.

3. The method of doping impurities according to claim 1, further comprising the step of:
   changing the surface of the solid base substance into amorphous structure by using plasma, before the step of doping impurities.

4. The method of doping impurities according to claim 1, wherein the optical characteristics include any one of a refraction index, extinction coefficient, absorption coefficient, reflectance, transmittance, and absorption rate.

5. The method of doping impurities according to claim 1, wherein the solid base substance is a crystal silicon substrate.

6. The method of doping impurities according to claim 1, wherein the light antireflection layer is a transparent layer that has a refraction index lower than that of the impurity doped region.

7. The method of doping impurities according to claim 1, wherein the light antireflection layer is a dielectric multilayer.

8. The method of doping impurities according to claim 1, wherein light having a wavelength of 500 nm or more is used in the step of performing annealing.

9. The method of doping impurities according to claim 1, further comprising the step of:
   feeding back the measurement results obtained in the step of measuring to the thickness of the light antireflection layer.

10. The method of doping impurities according to claim 1, further comprising the step of:
    feeding back the measurement results obtained in the step of measuring to a plasma doping step.

* * * * *